United States Patent
Negley (10) Patent No.: US 7,118,262 B2
(45) Date of Patent: Oct. 10, 2006

(54) REFLECTIVE OPTICAL ELEMENTS FOR SEMICONDUCTOR LIGHT EMITTING DEVICES

(75) Inventor: Gerald H. Negley, Carrboro, NC (US)

(73) Assignee: Cree, Inc., Durham, NC (US)

( * ) Notice: Subject to any disclaimer, the term of this patent is extended or adjusted under 35 U.S.C. 154(b) by 137 days.

(21) Appl. No.: 10/898,608

(22) Filed: Jul. 23, 2004

(65) Prior Publication Data

US 2006/0018122 A1    Jan. 26, 2006

(51) Int. Cl.
*F21Y 101/02*    (2006.01)

(52) U.S. Cl. .................. 362/555; 362/560; 362/311; 362/307; 362/800

(58) Field of Classification Search ................ 362/555, 362/560, 311, 307, 308, 309, 296, 341, 326, 362/327, 329, 800
See application file for complete search history.

(56) References Cited

U.S. PATENT DOCUMENTS

| | | | |
|---|---|---|---|
| 4,918,497 A | 4/1990 | Edmond | |
| 4,966,862 A | 10/1990 | Edmond | |
| 5,027,168 A | 6/1991 | Edmond | |
| 5,210,051 A | 5/1993 | Carter, Jr. | |
| 5,338,944 A | 8/1994 | Edmond et al. | |
| 5,393,993 A | 2/1995 | Edmond et al. | |
| 5,416,342 A | 5/1995 | Edmond et al. | |
| 5,523,589 A | 6/1996 | Edmond et al. | |
| 5,604,135 A | 2/1997 | Edmond et al. | |
| 5,631,190 A | 5/1997 | Negley | |
| 5,638,469 A | 6/1997 | Feldman et al. | |
| 5,739,554 A | 4/1998 | Edmond et al. | |
| 5,912,477 A | 6/1999 | Negley | |
| 6,120,600 A | 9/2000 | Edmond et al. | |
| 6,187,606 B1 | 2/2001 | Edmond et al. | |
| 6,201,262 B1 | 3/2001 | Edmond et al. | |
| 6,464,373 B1 | 10/2002 | Petrick | |
| 6,598,998 B1 * | 7/2003 | West et al. | 362/307 |
| 6,607,286 B1 | 8/2003 | West et al. | |
| 6,674,096 B1 * | 1/2004 | Sommers | 257/98 |
| 6,679,621 B1 * | 1/2004 | West et al. | 362/327 |
| 6,951,415 B1 * | 10/2005 | Amano et al. | 362/520 |
| 6,955,459 B1 * | 10/2005 | Mochizuki et al. | 362/602 |
| 2002/0123164 A1 | 9/2002 | Slater, Jr. et al. | |
| 2003/0006418 A1 | 1/2003 | Emerson et al. | |
| 2003/0193807 A1 | 10/2003 | Rizkin et al. | |
| 2004/0041222 A1 | 3/2004 | Loh | |

FOREIGN PATENT DOCUMENTS

| | | |
|---|---|---|
| JP | 2000-207919 A | 7/2000 |
| JP | 2002-208305 A | 7/2002 |

OTHER PUBLICATIONS

Slater, Jr. et al., *Phosphor-Coated Light Emitting Diodes including Tapered Sidewalls and Fabrication Methods Therefor*, U.S. Appl. No. 10/659,241, filed Sep. 9, 2003.

(Continued)

*Primary Examiner*—Laura Tso
(74) *Attorney, Agent, or Firm*—Myers Bigel Sibley & Sajovec, P.A.

(57) ABSTRACT

Optical elements for semiconductor light emitting devices include a body that is configured to attach to a semiconductor light emitting device. The body includes an integral lens. A mirror is provided in and/or on the body. The body, the lens and the mirror are positioned such that, in operation, light that is emitted from the semiconductor light emitting device enters the body, is reflected from the mirror and passes through the lens to emerge from the body.

35 Claims, 3 Drawing Sheets

OTHER PUBLICATIONS

Negley et al., *Solid Metal Block Mounting Substrates for Semiconductor Light Emitting Devices and Oxidizing Methods for Fabricating Same*, U.S. Appl. No. 10/659,108, filed Sep. 9, 2003.
Notification of Transmittal of the International Search Report and the Written Opinion of the International Searching Authority, or the Declaration, International Search Report and Written Opinion of the International Search Authority, PCT/US2005/022108, Feb. 17, 2006.

* cited by examiner

REFLECTIVE OPTICAL ELEMENTS FOR SEMICONDUCTOR LIGHT EMITTING DEVICES

FIELD OF THE INVENTION

This invention relates to semiconductor light emitting devices and, more particularly, to packaging of semiconductor light emitting devices for light emission.

BACKGROUND OF THE INVENTION

Semiconductor light emitting devices, such as Light Emitting Diodes (LEDs) or laser diodes, are widely used for many applications. As is well known to those having skill in the art, a semiconductor light emitting device includes one or more semiconductor layers that are configured to emit coherent and/or incoherent light upon energization thereof. It is also known that a semiconductor light emitting device generally is packaged to provide external electrical connections, heat sinking, lenses or waveguides, environmental protection and/or other functions.

For example, it may be desirable to redirect the light that is emitted by a semiconductor light emitting device from one direction to another. In some applications it may be desirable to redirect light that is generally emitted in a direction perpendicular to the emitting surface of the semiconductor light emitting device (generally referred to herein as "vertical") to a direction that is generally parallel to the emitting surface of the semiconductor light emitting device (generally referred to as "horizontal"). It also may be desirable to reorient the light over 360° in the horizontal direction. Such redirected light may be useful in backlighting applications, such as backlighting for Liquid Crystal Displays (LCD) or "glowing wall" types of lighting applications.

U.S. Pat. No. 6,607,286 to West et al., entitled "Lens and Lens Cap with Sawtooth Portion for Light Emitting Diode" describes in the Abstract thereof, that a lens mounted to a light emitting diode package internally redirects light within the lens so that a majority of light is emitted from the lens approximately perpendicular to a package axis of the light emitting diode package. In one embodiment, the light emitted by the light emitting diode package is refracted by a sawtooth portion of the lens and reflected by a total internal reflection portion of the lens.

Moreover, U.S. Pat. No. 5,638,469 to Feldman, et al., entitled "Microelectronic Module Having Optical and Electrical Interconnects", describes various techniques for redirecting optical beams using holograms and/or mirrors, and solder bumps for alignment and/or electrical connections.

SUMMARY OF THE INVENTION

Optical elements for semiconductor light emitting devices according to various embodiments of the present invention include a body that is configured to attach to a semiconductor light emitting device. The body includes a lens integral therewith. A mirror is provided in and/or on the body. The body, the lens and the mirror are positioned such that, in operation, light that is emitted from the semiconductor light emitting device enters the body, is reflected from the mirror and passes through the lens to emerge from the body. In some embodiments, light that is emitted from the semiconductor light emitting device in a first direction enters the body, is reflected from the mirror and passes through the lens to emerge from the body in a second direction that is perpendicular to the first direction, and in some embodiments, over 360° in the second direction that is perpendicular to the first direction.

In some embodiments the mirror comprises a reflective surface and/or a reflective plug that extends in and/or on the body. Moreover, in some embodiments, the lens comprises a portion of an outer surface of the body. In some embodiments a semiconductor light emitting device includes a semiconductor light emitting element on a mounting substrate and the body is configured to attach to the mounting substrate. Optical elements according to any of the above-described embodiments may be combined with a semiconductor light emitting device and attached, for example, to the mounting substrate thereof. In some embodiments an optical coupling medium may be provided between the semiconductor light emitting element and the body.

Optical elements for semiconductor light emitting devices according to other embodiments of the present invention include a body that is transparent to optical radiation from a semiconductor light emitting device. The body includes a base that is configured to attach to a semiconductor light emitting device, a cavity that is remote from the base and that defines a cavity surface, and a lens element on a surface of the body between the base and the cavity. A mirror is provided on at least a portion of the cavity surface. As was described above, in some embodiments, light is emitted from the semiconductor light emitting device perpendicular to the base and emerges from the body parallel to the base, and in some embodiments over 360°. The mirror may comprise a reflective surface and/or plug. In some embodiments the cavity is an inverted conical cavity and the cavity surface is an inverted conical cavity surface. The optical element may be attached to and/or combined with a semiconductor light emitting device as was described above and an optical coupling medium also may be provided as was described above.

In yet other embodiments of the present invention, an optical element for a semiconductor light emitting device includes a truncated spherical body that is transparent to optical radiation from a semiconductor light emitting device. The truncated spherical body includes a base that is configured to attach to a semiconductor light emitting device, and an inverted conical cavity that is remote from the base and that defines an inverted conical cavity surface. An inverted conical mirror is provided on the inverted conical cavity surface. In some embodiments the truncated spherical body and the inverted conical cavity include coincident axes and light is emitted from the semiconductor light emitting device and enters the body parallel to the coincident axes and emerges parallel to the base over 360°. The optical element may be symmetrical about the coincident axes. In other embodiments the inverted conical cavity and/or the truncated spherical body includes a curved and/or segmented surface when viewed in cross section. The inverted conical mirror can comprise a reflective coating and/or a reflective inverted conical plug. A plug also may be provided on the reflective coating opposite the inverted conical cavity surface to at least partially fill the remainder of the inverted conical cavity. These embodiments may be combined with and/or attached to a semiconductor light emitting device as was already described.

Still other embodiments of the present invention provide an optical element for a semiconductor light emitting device that includes an inverted conical mirror having an inverted conical reflective outer surface and that is configured to attach to a semiconductor light emitting device such that in operation, light that is emitted from the semiconductor light emitting device is reflected from the inverted conical reflective outer surface. In some embodiments, the light is reflected over 360° and the optical element is symmetrical about an axis. The inverted conical mirror may include a curved and/or segmented surface when viewed in cross section.

DETAILED DESCRIPTION

The present invention now will be described more fully hereinafter with reference to the accompanying drawings, in which embodiments of the invention are shown. However, this invention should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. As used herein the term "and/or" includes any and all combinations of one or more of the associated listed items.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element such as a layer or region is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Furthermore, relative terms, such as "lower", "base", or "horizontal", and "upper", "top", or "vertical" may be used herein to describe one element's relationship to another element as illustrated in the Figures. It will be understood that relative terms are intended to encompass different orientations of the device in addition to the orientation depicted in the Figures. For example, if the device in the Figures is turned over, elements described as being on the "lower" side of other elements would then be oriented on "upper" sides of the other elements. The exemplary term "lower", can therefore, encompasses both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

Embodiments of the present invention are described herein with reference to cross section illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, a region illustrated or described as conical may, typically, have a rounded vertex and rough and/or nonlinear features. Thus, the regions illustrated in the figures are schematic in nature and their shapes are not intended to illustrate the precise shape of a region and are not intended to limit the scope of the present invention. Moreover, terms such as "horizontal", "vertical" and "perpendicular" indicate general directions or relationships rather than precise 0° or 90° orientations.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 1:
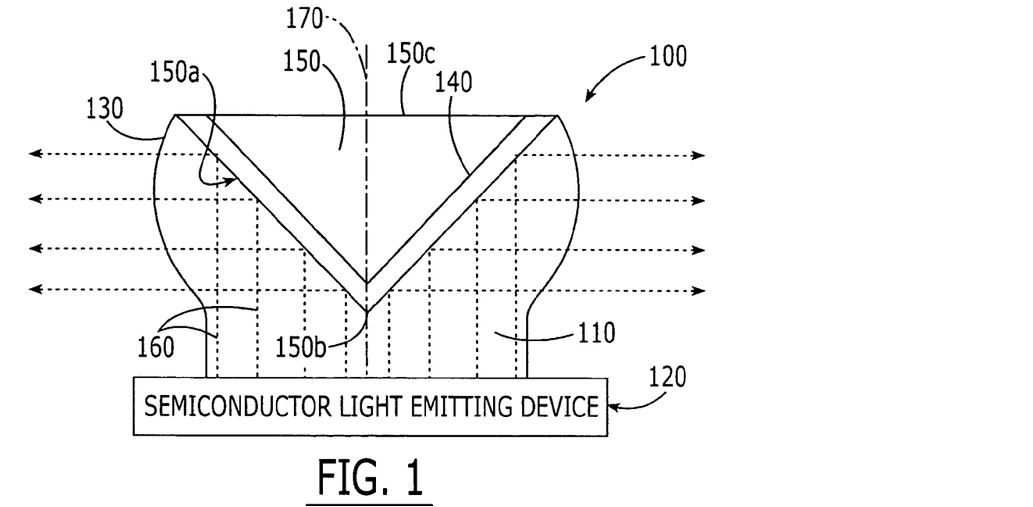
FIG. 1 is a cross-sectional view of an optical element according to various embodiments of the present invention.

FIG. 1 is a cross-sectional view of an optical element for a semiconductor light emitting device according to various embodiments of the present invention. Referring now to FIG. 1, an optical element 100 according to various embodiments of the present invention includes a body 110 that is configured to attach to a semiconductor light emitting device 120. It will be understood by those having skill in the art that although direct attachment of the body 110 to a semiconductor light emitting device 120 is shown in FIG. 1, various intermediary attaching mechanisms also may be provided.

Still referring to FIG. 1, the body 110 includes a lens 130 integral therewith. In FIG. 1 the lens 130 is formed by at least a portion of the outer surface of the body that is concave with respect to the outgoing light path. However, in other embodiments the lens also may be formed using one or more elements that are fabricated in or on the body 110 so as to be integral therewith. Moreover, depending on the application, convex, concave and/or segmented lenses 130 may be provided.

Still referring to FIG. 1, a fixedly attached mirror 140 is provided that is in and/or on the body 110. For example, in FIG. 1 a cavity 150 is provided in the body 110 and the mirror 140 is provided on at least a portion of the surface 150a of the cavity 150. In other embodiments, the mirror 140 is at least partially embedded within the body 110 and/or may extend on the outer surface of the body 110. It also will be understood that, as used herein, a mirror employs reflection as its primary optical mechanism, rather than refraction or diffraction. However, as used herein, a mirror need not form an image. Moreover, it will be understood that the term "total internal reflection" actually employs refraction as its primary optical mechanism, notwithstanding use of the terminology "reflection".

Still referring to FIG. 1, the body 110, the lens 130 and the mirror 140 are fixedly positioned such that in operation, light that is emitted from the semiconductor light emitting device 120 enters the body 110, is reflected from the mirror 140 and passes through the lens 130 to emerge from the body, as shown by the ray tracings 160. It will be understood by those having skill in the art that as used herein, "light" refers to any radiation, visible and/or invisible (such as ultraviolet) that is emitted by a semiconductor light emitting device 120.

Additional discussion of the mirror 140 now will be provided. In some embodiments, the mirror may be a planar or nonplanar obliquely extending mirror, oriented such that light is emitted from the optical element as a single beam. In other embodiments, the mirror may be a V-shaped mirror to emit light as two beams, as shown in FIG. 1. In particular, light that is emitted from the semiconductor light emitting device 120 in a first direction, shown as vertical in FIG. 1, enters the body 130, is reflected from the mirror 140 and passes through the lens 130 to emerge from the body 110 in a second direction, shown as horizontal in FIG. 1, that is perpendicular to the first direction. In some embodiments, the axis of the lens 130 extends along the horizontal direction.

Figure 2:
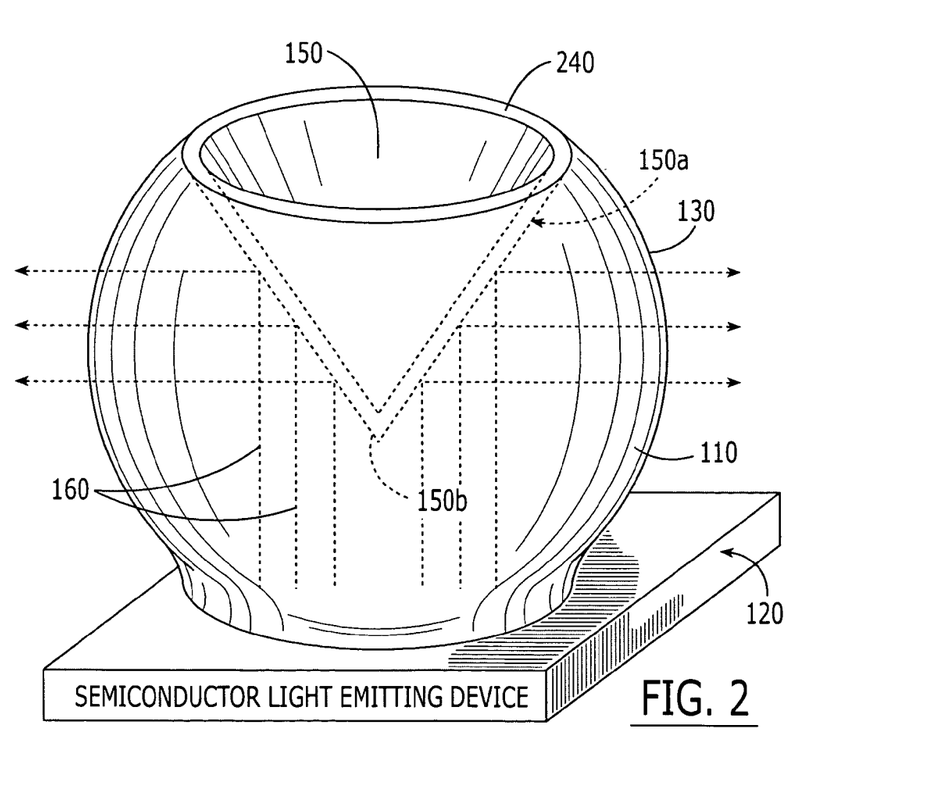
FIG. 2 is a perspective view of an optical element according to various embodiments of the present invention.
Figure 3:
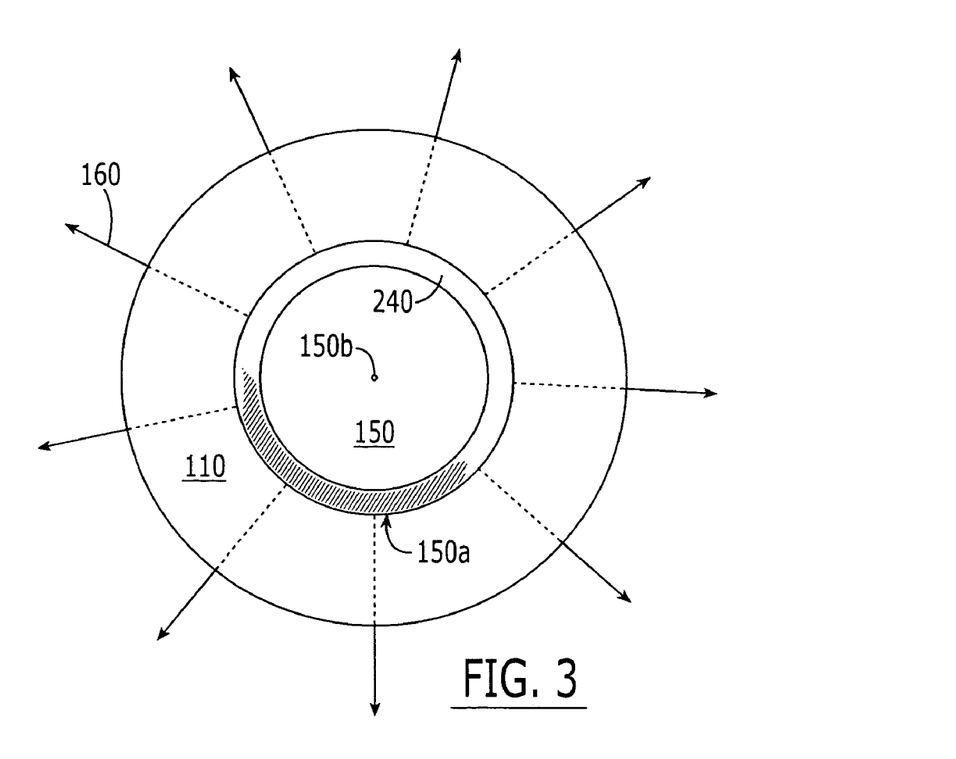
FIG. 3 is a top view of an optical element of FIG. 2, according to various embodiments of the present invention.

As described above, light may emerge in a horizontal direction in a single beam such as a single beam emerging to the left or right in FIG. 1, or in a pair of beams emerging to the left and to the right as shown in FIG. 1. Moreover, in other embodiments of the present invention, although the mirror may appear as a V-shaped mirror in cross section, the mirror is actually an inverted conical mirror 240 as shown in FIG. 2 so that light that is emitted from the body may be emitted in a horizontal direction over 360°, as shown in the top view of FIG. 3. Moreover, other embodiments may use partial cone sections and/or other elements to emit light in the horizontal direction over 90°, 180° or other angular ranges.

Figure 4:
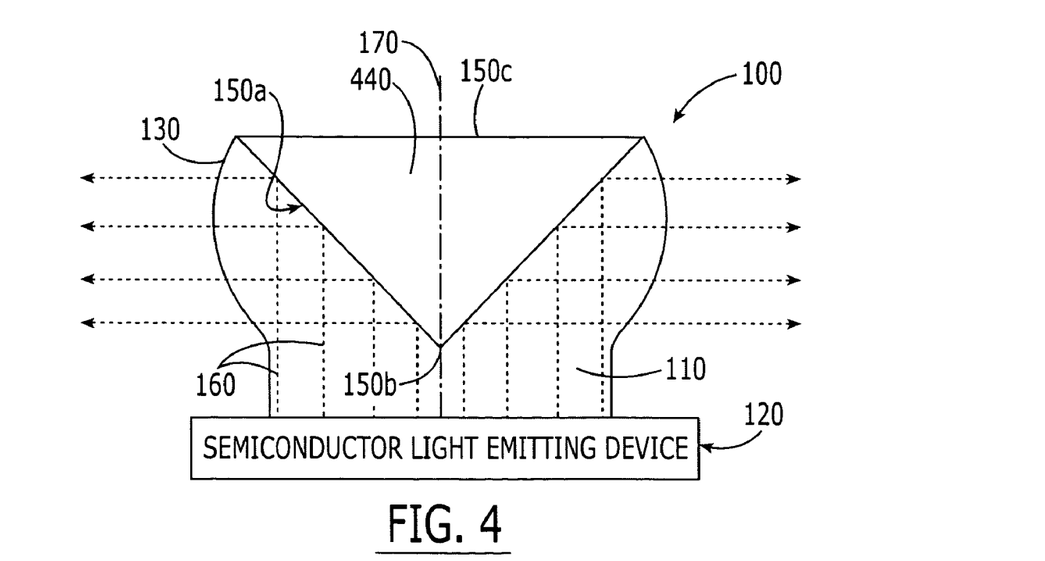
FIG. 4 is a cross-sectional view of an optical element according to other embodiments of the present invention.

As was described above in connection with FIG. 1, the mirror 140 may comprise a reflective surface that extends in and/or on the body 110. In some embodiments at least some of a remaining portion of the cavity 150 may be filled with a plug that comprises passivating and/or other material that can, for example, reduce degradation of the mirror due to environmental factors. In yet other embodiments, as shown in FIG. 4, the mirror may itself comprise a reflective plug 440 that can at least partially fill the cavity.

Figure 5:
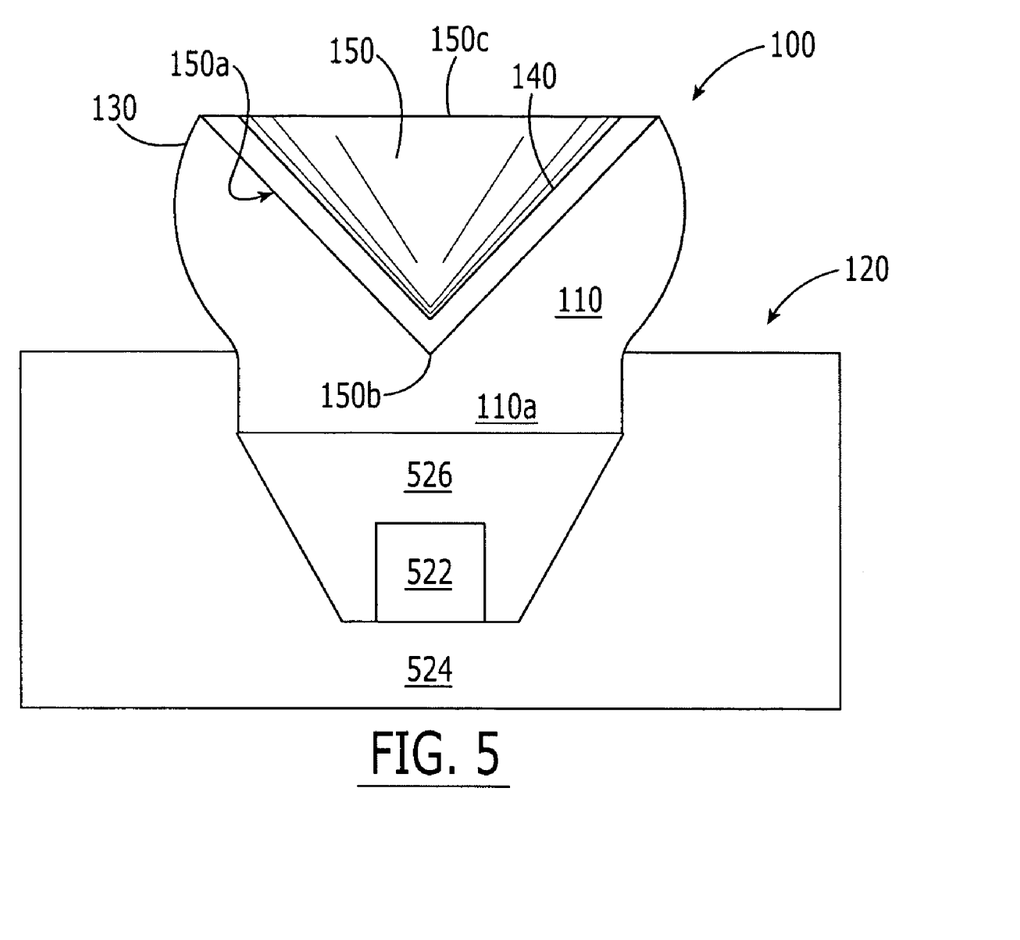
FIG. 5 is a cross-sectional view of an optical element according to yet other embodiments of the present invention.

FIG. 5 is a cross-sectional view of other embodiments of the invention which illustrate mounting of an optical element 110 according to various embodiments of the present invention on a semiconductor light emitting device 120. More specifically, referring to FIG. 5, a semiconductor light emitting device 120 is shown attached to the body 110 of the optical element 100. In some embodiments the body 110 includes a base 110a, and the semiconductor light emitting device 120 includes a semiconductor light emitting element 522 on a mounting substrate 524, wherein the body 110, including the base 110a, is configured to attach to the mounting substrate 524 such that the semiconductor light emitting element 522 is between the mounting substrate 524 and the body 110. The base 110a need not have a planar outer surface and/or can have various surface features formed therein. An optical coupling medium 526 such as an optical gel, may be provided between the semiconductor light emitting element 522 and the body 110.

Semiconductor light emitting elements 522 may include a light emitting diode, a laser diode and/or other semiconductor device that includes one or more semiconductor layers, which may include silicon, silicon carbide, gallium nitride and/or other semiconductor materials, a substrate which may include sapphire, silicon, silicon carbide and/or other microelectronic substrates, and one or more contact layers, which may include metal and/or other conductive layers. In some embodiments, ultraviolet, blue and/or green LEDs may be provided. The design and fabrication of semiconductor light emitting devices are well known to those having skill in the art and need not be described in detail herein.

For example, light emitting devices according to some embodiments of the present invention may include structures such as the gallium nitride-based LED and/or laser structures fabricated on a silicon carbide substrate such as those devices manufactured and sold by Cree, Inc. of Durham, N.C. The present invention may be suitable for use with LED and/or laser structures that provide active regions such as described in U.S. Pat. Nos. 6,201,262; 6,187,606; 6,120,600; 5,912,477; 5,739,554; 5,631,190; 5,604,135; 5,523,589; 5,416,342; 5,393,993; 5,338,944; 5,210,051; 5,027,168; 5,027,168; 4,966,862 and/or 4,918,497, the disclosures of which are incorporated herein by reference in their entirety as if set forth fully herein. Other suitable LED and/or laser structures are described in published U.S. Patent Application Publication No. US 2003/0006418 A1 entitled Group III Nitride Based Light Emitting Diode Structures With a Quantum Well and Superlattice, Group III Nitride Based Quantum Well Structures and Group III Nitride Based Superlattice Structures, published Jan. 9, 2003, as well as published U.S. Patent Application Publication No. US 2002/0123164 A1 entitled Light Emitting Diodes Including Modifications for Light Extraction and Manufacturing Methods Therefor, the disclosures of which are hereby incorporated herein by reference in their entirety as if set forth fully herein. Furthermore, phosphor coated LEDs, such as those described in U.S. application Ser. No. 10/659,241, entitled Phosphor-Coated Light Emitting Diodes Including Tapered Sidewalls and Fabrication Methods Therefor, filed Sep. 9, 2003, the disclosure of which is incorporated by reference herein as if set forth fully, may also be suitable for use in embodiments of the present invention. The LEDs and/or lasers may be configured to operate such that light emission occurs through the substrate. In such embodiments, the substrate may be patterned so as to enhance light output of the devices as is described, for example, in the above-cited U.S. Patent Application Publication No. US 2002/0123164 A1.

Moreover, mounting substrates 524 may include solid metal block mounting substrates as described, for example, in U.S. patent application Ser. No. 10/659,108 to Negley et al. entitled Solid Metal Block Mounting Substrates for Semiconductor Light Emitting Devices and Oxidizing Methods for Fabricating Same, filed Sep. 9, 2003, the disclosure of which is hereby incorporated by reference in its entirety as if set forth fully herein. Other mounting substrates may include light emitting die packages that are described in U.S. Patent Application Publication No. US 2004/0041222 A1 to Loh entitled Power Surface Mount Light Emitting Die Package, filed May 27, 2003, the disclosure of which is hereby incorporated herein by reference in its entirety as if set forth fully herein. Moreover, other conventional mounting substrates for light emitting devices also may be used. The optical coupling medium 526 may include optical gel as described, for example, in the above-cited U.S. patent application Ser. No. 10/659,108 and U.S. Patent Application Publication No. US 2004/0041222 A1, and may also include phosphor, scattering elements and/or other optical elements therein. The phosphor may be configured to convert at least some of the light that is emitted from the light emitting device so that the light that emerges appears as white light.

It also will be understood that embodiments of FIGS. 1–5 may be provided in various combinations and subcombinations.

Additional discussion of FIGS. 1–5 now will be provided. In particular, FIGS. 1–5 also may be regarded as illustrating optical elements according to other embodiments of the present invention that include a body 110 that is transparent to optical radiation from a semiconductor light emitting device 120. As used herein, the term "transparent" means that at least some optical radiation that enters the body 110 is emitted from the body. The body includes a base 110*a* that is configured to attach to a semiconductor light emitting device, a cavity 150 that is remote from the base 110 that defines a cavity surface 150*a* and a lens element 130 on a surface of the body 110 between the base 110*a* and the cavity 150. A mirror 140 is provided on at least a portion of the cavity surface 150*a*. The base 110*a*, cavity 150, lens element 130 and mirror 140 are positioned such that, in operation, light 160 that is emitted from the semiconductor light emitting device 120 enters the body 110 perpendicular to the base 110*a*, is reflected from the mirror 140 and passes through the lens 130 to emerge from the body 110 parallel to the base 110*a* and, in some embodiments, over 360°. The mirror 140 may comprise a reflective surface that extends on the cavity surface 150*a* and/or a reflective plug 440 that extends on the cavity surface 150*a*. Moreover, as also shown in FIGS. 1–5, in some embodiments, the cavity is an inverted conical cavity and the cavity surface is an inverted conical cavity surface. As used herein, the term "inverted" refers to a conical cavity/surface having a vertex 150*b* that is closer to the light emitting device 120 than the base 150*c* thereof. In some embodiments, the body 110 and the cavity 150 include coincident axes 170. In some embodiments, the optical element 100 is symmetrical about the coincident axes 170.

Moreover, FIGS. 1–5 illustrate other embodiments of the present invention wherein an optical element 100 for a semiconductor light emitting device comprises a truncated spherical body 110 that is transparent to optical radiation from a semiconductor light emitting device 120. The truncated spherical body 110 includes a base 100*a* that is configured to attach to a semiconductor light emitting device 120 and an inverted conical cavity 150 that is remote from the base 110*a* and that defines an inverted conical cavity surface 150*a*. An inverted conical mirror 140 is provided on the inverted conical cavity surface 150*a*.

It will be understood by those having skill in the art that the mirror 140, cavity 150 and cavity surface 150*a* include planar surfaces when viewed in the cross-sectional views of FIGS. 1, 4 or 5. However, in other embodiments of the present invention the inverted conical cavity 150 and/or the inverted conical mirror 140 includes a curved and/or segmented surface when viewed in cross section. Similarly, although the truncated spherical body 110 is shown having a spherical section outer surface when viewed in cross section, other curved and/or segmented outer surface shapes may be provided when viewed in cross section.

Finally, FIGS. 1–5 also may be regarded as illustrating other embodiments of the present invention wherein an optical element 100 for a semiconductor light emitting device 120 includes an inverted conical mirror 140 that includes an inverted conical reflective outer surface and is configured to attach to a semiconductor light emitting device 120, either directly or indirectly, such that, in operation, light that is emitted from the semiconductor light emitting device 120 is reflected from the inverted conical reflective outer surface.

Some embodiments of the present invention may provide 360° side-emission LEDs for large area LCD and/or television backlighting. Other backlighting applications or other applications may be provided. Embodiments of the present invention can reflect the light emission from a generally vertical light emitting device to a generally horizontal, and in some embodiments, 360° horizontal, nature. Accordingly, a vertical light emitting device, including a light emitting element and a mounting substrate, may also be used for horizontal emissions by attaching a lens element according to various embodiments of the present invention.

Embodiments of the present invention use mirrors and, in some embodiments, do not use total internal reflection optics or holographic optics. Embodiments that use mirrors instead of total internal reflection or holographic optics can reduce or prevent light bleed-through, and may obviate the need to paint or cover the top surface of the package with an opaque material.

Optical elements may be formed, according to various embodiments of the present invention, by providing a mirror 140, 240 and/or 440, and injection molding or otherwise forming the body 110 around the mirror. In other embodiments a mirror may be glued or otherwise attached to a prefabricated body 110. In still other embodiments, selective metallization may be performed on the surface of a body 110 using conventional metalization and/or deposition techniques.

In some embodiments, the body 110 can comprise clear silicone and the mirror 140, 240 and/or 440 can comprise silver. The body also may include phosphor, light scattering elements and/or other optical elements therein. The phosphor may be configured to convert at least some of the light that is emitted from the light emitting device so that the light that emerges from the body appears as white light.

In addition, the mirror and the lens 130 can have complex shapes so that various edge emitting viewing angles and/or configurations can be achieved. For example, a more complex shape of the mirror 140, 240 and/or 440 may be provided to compensate for uneven light emission from the light emitting device 120. Moreover, complex shapes of lenses 130 may be provided to target the light emission in a horizontal direction and/or to provide further compensation for uneven illumination from the light emitting device 120.

Dimensionally, in one specific embodiment, the spherical body 110 may have a radius of about 2.16 mm. The vertex 150*b* of the cavity 150 may form a 90° angle. The base 110*a* may be about 0.45 mm thick and have a diameter of about 5.1 mm. The height of the lens body 110 may be about 3.5 mm. The diameter of the base 150c of the cavity may be about 5.1 mm. The body 110 may comprise clear silicone having light transmittance of at least about 92% over 400–700 nm.

In the drawings and specification, there have been disclosed embodiments of the invention and, although specific terms are employed, they are used in a generic and descriptive sense only and not for purposes of limitation, the scope of the invention being set forth in the following claims.

What is claimed is:

1. An optical element for a semiconductor light emitting device, comprising:
   a body that is configured to attach to a semiconductor light emitting device and that includes a lens integral therewith; and
   a mirror that is in the body;
   the body, the lens and the mirror being positioned such that, in operation, light that is emitted from the semiconductor light emitting device enters the body, is reflected from the mirror and passes through the lens to emerge from the body;
   wherein the mirror comprises a reflective plug that extends in the body.

2. An optical element according to claim 1 wherein the body, the lens and the mirror are positioned such that, in operation, light that is emitted from the semiconductor light emitting device in a first direction enters the body, is reflected from the mirror and passes through the lens to emerge from the body in a second direction that is perpendicular to the first direction.

3. An optical element according to claim 1 wherein the body, the lens and the mirror are positioned such that, in operation, light that is emitted from the semiconductor light emitting device in a first direction enters the body, is reflected from the mirror and passes through the lens to emerge from the body over 360° in a second direction that is perpendicular to the first direction.

4. An optical element according to claim 1 wherein the lens comprises a portion of an outer surface of the body.

5. An optical element according to claim 1 wherein the semiconductor light emitting device comprises a semiconductor light emitting element on a mounting substrate and wherein the body is configured to attach to the mounting substrate.

6. An optical element according to claim 1 in combination with the semiconductor light emitting device that is attached to the body.

7. An optical element according to claim 6 wherein the semiconductor light emitting device comprises a semiconductor light emitting element on a mounting substrate and wherein the body is configured to attach to the mounting substrate such that the semiconductor light emitting element is between the mounting substrate and the body.

8. An optical element according to claim 7 further comprising an optical coupling medium between the semiconductor light emitting element and the body.

9. An optical element for a semiconductor light emitting device comprising:
   a body that is transparent to optical radiation from a semiconductor light emitting device, the body including a base that is configured to attach to a semiconductor light emitting device, a cavity that is remote from the base and that defines a cavity surface and a lens element on a surface of the body between the base and the cavity; and
   a mirror on at least a portion of the cavity surface;
   wherein the mirror comprises a reflective plug in the cavity.

10. An optical element according to claim 9 wherein the base, the cavity the lens element and the mirror are positioned such that, in operation, light that is emitted from the semiconductor light emitting device enters the body perpendicular to the base, is reflected from the mirror and passes through the lens to emerge from the body parallel to the base.

11. An optical element according to claim 9 wherein the base, the cavity the lens element and the mirror are positioned such that, in operation, light that is emitted from the semiconductor light emitting device enters the body perpendicular to the base, is reflected from the mirror and passes through the lens to emerge from the body parallel to the base over 360°.

12. An optical element according to claim 9 wherein the cavity is an inverted conical cavity and the cavity surface is an inverted conical cavity surface.

13. An optical element according to claim 9 wherein the semiconductor light emitting device comprises a semiconductor light emitting element on a mounting substrate and wherein the base is configured to attach to the mounting substrate.

14. An optical element according to claim 9 in combination with the semiconductor light emitting device that is attached to the body.

15. An optical element according to claim 14 wherein the semiconductor light emitting device comprises a semiconductor light emitting element on a mounting substrate and wherein the base is configured to attach to the mounting substrate such that the semiconductor light emitting element is between the mounting substrate and the body.

16. An optical element according to claim 15 further comprising an optical coupling medium between the semiconductor light emitting element and the body.

17. An optical element for a semiconductor light emitting device comprising:
   a truncated spherical body that is transparent to optical radiation from a semiconductor light emitting device, the truncated spherical body including a base that is configured to attach to a semiconductor light emitting device, and an inverted conical cavity that is remote from the base and that defines an inverted conical cavity surface; and
   an inverted conical mirror on the inverted conical cavity surface.

18. An optical element according to claim 17 wherein the truncated spherical body and the inverted conical cavity include coincident axes and wherein the base is positioned such that, in operation, light that is emitted from the semiconductor light emitting device enters the body parallel to the coincident axes, is reflected from the inverted conical mirror and emerges from the truncated spherical body parallel to the base over 360°.

19. An optical element according to claim 17 wherein the inverted conical cavity includes a curved and/or segmented surface when viewed in cross section.

20. An optical element according to claim 17 wherein the truncated spherical body includes a curved and/or segmented surface when viewed in cross section.

21. An optical element according to claim 17 wherein the inverted conical mirror comprises a reflective coating that extends on the inverted conical cavity surface.

22. An optical element according to claim 17 wherein the inverted conical mirror comprises a reflective inverted conical plug in the inverted conical cavity.

23. An optical element according to claim 21 further comprising:
a plug on the reflective coating opposite the inverted conical cavity.

24. An optical element according to claim 17 wherein the semiconductor light emitting device comprises a semiconductor light emitting element on a mounting substrate and wherein the base is configured to attach to the mounting substrate.

25. An optical element according to claim 17 in combination with the semiconductor light emitting device that is attached to the body.

26. An optical element according to claim 25 wherein the semiconductor light emitting device comprises a semiconductor light emitting element on a mounting substrate and wherein the base is configured to attach to the mounting substrate such that the semiconductor light emitting element is between the mounting substrate and the body.

27. An optical element according to claim 26 further comprising an optical coupling medium between the semiconductor light emitting element and the body.

28. An optical element according to claim 18 wherein the optical element is symmetrical about the coincident axes.

29. An optical element for a semiconductor light emitting device, comprising:
a body that is configured to attach to a semiconductor light emitting device and that includes a lens integral therewith; and
a V-shaped mirror that is in and/or on the body;
the body, the lens and the V-shaped mirror being positioned such that, in operation, light that is emitted from the semiconductor light emitting device enters the body, is reflected from the V-shaped mirror and passes through the lens to emerge from the body as two beams.

30. An optical element according to claim 29 wherein the body, the lens and the V-shaped mirror are positioned such that, in operation, light that is emitted from the semiconductor light emitting device in a first direction enters the body, is reflected from the V-shaped mirror and passes through the lens to emerge from the body in two second directions that are perpendicular to the first direction.

31. An optical element according to claim 29 wherein the lens comprises a portion of an outer surface of the body.

32. An optical element according to claim 29 wherein the semiconductor light emitting device comprises a semiconductor light emitting element on a mounting substrate and wherein the body is configured to attach to the mounting substrate.

33. An optical element according to claim 29 in combination with the semiconductor light emitting device that is attached to the body.

34. An optical element according to claim 33 wherein the semiconductor light emitting device comprises a semiconductor light emitting element on a mounting substrate and wherein the body is configured to attach to the mounting substrate such that the semiconductor light emitting element is between the mounting substrate and the body.

35. An optical element according to claim 34 further comprising an optical coupling medium between the semiconductor light emitting element and the body.

* * * * *